(12) United States Patent
Chang et al.

(10) Patent No.: US 10,714,381 B2
(45) Date of Patent: Jul. 14, 2020

(54) SEMICONDUCTOR DEVICE HAVING COMPOSITE STRUCTURES AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Rong Yao Chang, Shanghai (CN); Yi Ying Zhang, Shanghai (CN); Hai Yang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 31 days.

(21) Appl. No.: 15/829,169

(22) Filed: Dec. 1, 2017

(65) Prior Publication Data

US 2018/0158724 A1   Jun. 7, 2018

(30) Foreign Application Priority Data

Dec. 2, 2016   (CN) .......................... 2016 1 1111226

(51) Int. Cl.
*H01L 21/768* (2006.01)
*H01L 23/522* (2006.01)
(Continued)

(52) U.S. Cl.
CPC .. *H01L 21/76816* (2013.01); *H01L 21/76877* (2013.01); *H01L 23/5226* (2013.01);
(Continued)

(58) Field of Classification Search
CPC ........... H01L 21/76816; H01L 23/5283; H01L 23/5226; H01L 21/76877; H01L 27/1157;
(Continued)

(56) References Cited

U.S. PATENT DOCUMENTS

2014/0106569 A1   4/2014  Oh et al.
2014/0162420 A1*  6/2014  Oh .................... H01L 27/11565
                                                    438/270
(Continued)

OTHER PUBLICATIONS

Lapedus, "What's Next for Nand?", May 19, 2016, Semiconductor Engineering, pp. 1/9-9/9.*
(Continued)

*Primary Examiner* — Steven H Loke
*Assistant Examiner* — Juanita B Rhodes
(74) *Attorney, Agent, or Firm* — Anova Law Group, PLLC

(57) ABSTRACT

A semiconductor device and a method for fabricating the semiconductor device are provided. The method includes forming a first composite structure, including a plurality of first composite layers, on a substrate, and forming a second composite structure, including a plurality of second composite layers on a surface portion of the first composite structure. The method also includes forming a first mask layer covering a sidewall of the second composite structure and a surface portion of the first composite structure and exposing at least another surface portion of the first composite structure. In addition, the method includes forming a second mask layer, on a surface portion of the second composite structure and spaced apart from the first mask layer by a first annular opening. Further, the method includes etching a top first layer of the first composite layers and a top first layer of the second composite layers.

16 Claims, 9 Drawing Sheets

(51) Int. Cl.
*H01L 23/528* (2006.01)
*H01L 27/1157* (2017.01)
*H01L 27/11575* (2017.01)
*H01L 27/11582* (2017.01)

(52) U.S. Cl.
CPC ...... *H01L 23/5283* (2013.01); *H01L 27/1157* (2013.01); *H01L 27/11575* (2013.01); *H01L 27/11582* (2013.01)

(58) Field of Classification Search
CPC ......... H01L 27/11582; H01L 27/11575; H01L 27/115
See application file for complete search history.

(56) References Cited

U.S. PATENT DOCUMENTS

2015/0137205 A1* 5/2015 Kim .................... H01L 29/7889
257/314
2017/0117222 A1* 4/2017 Kim .................. H01L 27/11575

OTHER PUBLICATIONS

The European Patent Office (EPO) The Extended European Search Report for 17204261.6 dated Apr. 30, 2018 10 Pages.

* cited by examiner

SEMICONDUCTOR DEVICE HAVING COMPOSITE STRUCTURES AND FABRICATION METHOD THEREOF

CROSS-REFERENCES TO RELATED APPLICATIONS

This application claims the priority of Chinese patent application No. 201611111226.4, filed on Dec. 2, 2016, the entirety of which is incorporated herein by reference.

FIELD OF THE DISCLOSURE

The present disclosure generally relates to the field of semiconductor manufacturing and, more particularly, relates to a semiconductor device and fabrication method thereof.

BACKGROUND

Flash memory is a type of long-term non-volatile storage device that does not require power to retain data, and has advantages of high integration, fast access speed and easiness to erase and rewrite. Therefore, flash memory has become the mainstream of non-volatile memory. Depending on the structure, the flash memory can be divided into two types: NOR flash memory and NAND flash memory. Compared to the NOR flash memory, the NAND flash memory can provide higher cell density, higher storage density, and faster access speed.

With the development of planar flash memory, semiconductor manufacturing process has made great progress. However, the current development of the planar flash memory has faced various challenges: physical limits, such as exposure technology limit, development technology limit, and storage electronics density limit, etc. Under this situation, a three-dimensional (3D) flash memory, such as a 3D NAND flash memory, is proposed to address the difficulties encountered in the planar flash memory and to further lower production cost of unit memory cell.

However, the conventional methods for forming a semiconductor device including the 3D NAND flash memory cells are complicated and with high cost. The disclosed device structures and methods are directed to solve one or more problems set forth above and other problems in the art.

BRIEF SUMMARY OF THE DISCLOSURE

One aspect of the present disclosure includes a method for fabricating a semiconductor device. The method includes forming a first composite structure including a core region and an edge region around the core region, on a substrate. The first composite structure includes a plurality of laminated layers of first composite layers. The method also includes forming a second composite structure on a first surface portion of the core region of the first composite structure. The second composite structure includes a plurality of laminated layers of second composite layers. In addition, the method includes forming a first mask layer covering a sidewall of the second composite structure and a second surface portion of the core region outside of an outer peripheral of the second composite structure and exposing at least a portion of the edge region of the first composite structure. Moreover, the method includes forming a second mask layer, on a surface portion of the second composite structure and spaced apart from the first mask layer by a first annular opening. Further, the method includes etching a top first layer of the first composite layers in the edge region and a top first layer of the second composite layers at a bottom of the first annular opening, using the first mask layer and the second mask layer as an etch mask.

Another aspect of the present disclosure includes a semiconductor device. The semiconductor device includes a dielectric layer on a substrate, and a plurality of laminated, stepped composite layers on the dielectric layer. Each composite layer includes an insulating layer and a control gate layer. The method for forming the plurality of laminated, stepped composite layers includes forming a first composite structure including a core region and an edge region around the core region, on the dielectric layer. The first composite structure includes a plurality of laminated layers of first composite layers, and each first composite layer includes a first sacrificial layer and a first insulating layer on the first sacrificial layer. The method also includes forming a second composite structure on a first surface portion of the core region of the first composite structure. The second composite structure includes a plurality of laminated layers of second composite layers, and each second composite layer includes a second sacrificial layer and a second insulating layer on the second sacrificial layer. In addition, the method includes forming a first mask layer, covering a sidewall of the second composite structure and a second surface portion of the core region outside of an outer peripheral of the second composite structure and exposing at least a portion of the edge region of the first composite structure. Moreover, the method includes forming a second mask layer, on a surface portion of the second composite structure and spaced apart from the first mask layer by a first annular opening. Further, the method includes etching a top first layer of the first composite layers in the edge region and a top first layer of the second composite layers at a bottom of the first annular opening, using the first mask layer and the second mask layer as an etch mask. The semiconductor device also includes a stepped dielectric layer in a stepped region of the plurality of laminated, stepped composite layers, and having a top surface coplanar with a surface of a top first layer of the composite layers.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
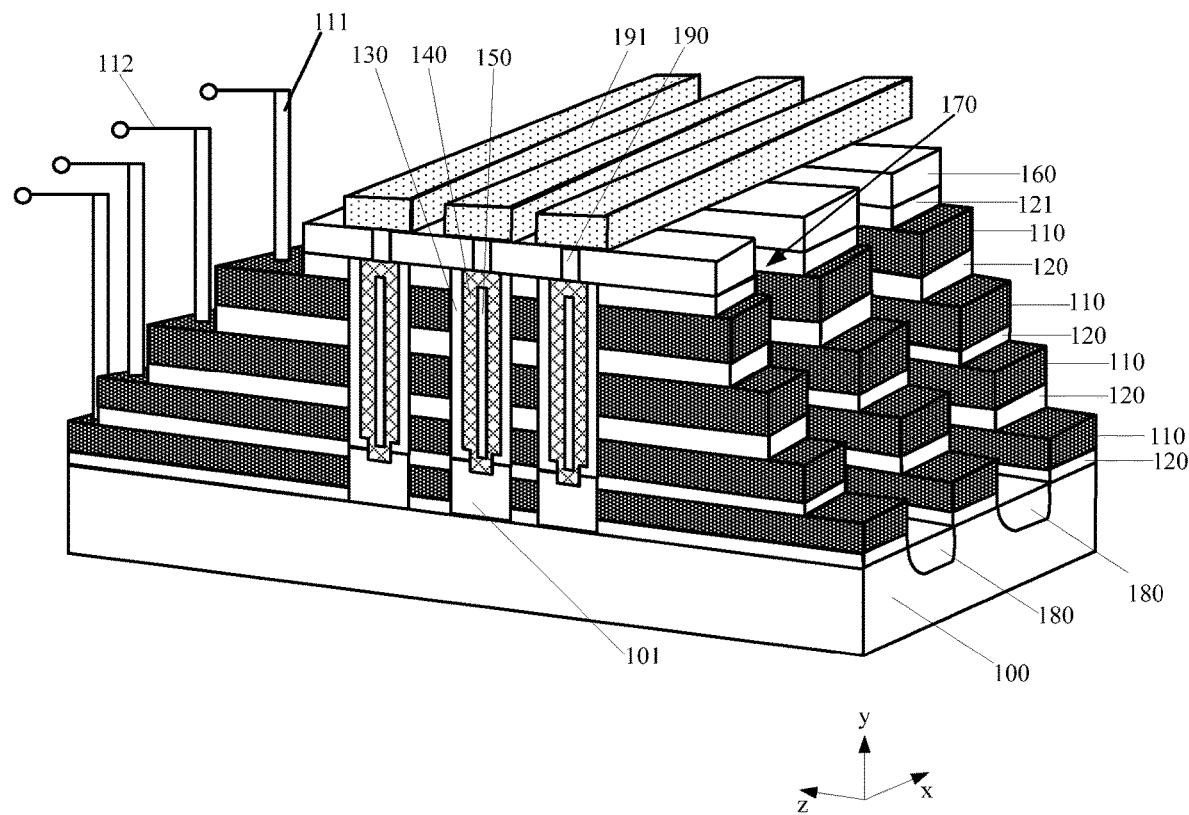
FIG. 1 illustrates a schematic diagram of a 3D NAND flash memory cell.

FIG. 1 illustrates a schematic diagram of a 3D NAND flash memory cell. Referring to FIG. 1, the 3D NAND flash memory cell includes: a semiconductor substrate 100; a plurality of laminated layers of control gate 110 formed on the semiconductor substrate 100; insulating layers 120 formed between adjacent layers of the control gate 110 and between the bottom control gate 110 and the semiconductor substrate 100; and a first dielectric layer 121 covering the top layer of the control gate 110 and the insulating layer 120. For convenience of illustration, only portions of the first dielectric layer 121 is illustrated. The 3D NAND flash memory cell also includes: through-holes (not illustrated) penetrating the control gate 110, the insulating layers 120 and the first dielectric layer 121; a substrate extension region 101 formed at the bottom of each through hole; a gate dielectric layer 130 formed on sidewall of each through-hole above the substrate extension region 101 and on portions of surface of the substrate extension region 101; a channel layer 140 formed in each through-hole and on the gate dielectric layer 130; a channel dielectric layer 150 formed in each through-hole and surrounded by the channel layer 140; and a second dielectric layer 160 covering the first dielectric layer 121, the gate dielectric layer 130, the channel layer 140, and the channel dielectric layer 150. In addition, the 3D NAND flash memory cell includes: trenches 170 penetrating the second dielectric layer 160, the first dielectric layer 121, the insulating layers 120, and the control gate 110; a source line doped region 180 formed in the semiconductor substrate 100 under each trench 170; a source line structure (not illustrated) completely filling each trench 170; a plurality of word line plugs 111 formed on the surface of each layer of the control gate 110; a plurality of word lines 112 formed on top of the word line plugs 111; a plurality of bit line plugs 190 penetrating the second dielectric layer 160 and connected to the channel layer 140; and a plurality of discrete bit lines 191 formed on top of the plurality of bit line plugs 190 and across the source line structures.

The plurality of laminated layers of the control gate 110 are stepped, and the pattern size of the plurality of laminated layers of the control gate 110 projected on the surface of the semiconductor substrate 100 increases layer by layer from top to bottom. The control gate 110 in upper layer is capable of exposing a surface portion of the control gate 110 in lower layer, and the surface of the control gate 110 in the lower layer exposed by the control gate 110 in the upper layer is connected to the word line plug 111. Each word line plug 111 is exclusively connected to the control gate 110 in one layer.

To form the stepped control gate 110 illustrated in FIG. 1, the method for forming the control gate 110 includes providing a semiconductor substrate, and forming a composite layer on the semiconductor substrate. The composite layer includes a plurality of layers of insulating layers and a plurality of layers of sacrificial layers that are stacked alternatively, a bottom layer of the composite layer is the insulating layer, and a top layer of the composite layer is the sacrificial layer. The method also includes forming a mask layer on the surface of the composite layer, and exposing the surface of the composite layer in the top layer outside of an outer peripheral of the mask layer by etching the sidewall and top surface of the mask layer. In addition, the method includes etching the exposed composite layer by using the etched mask layer as a mask until the surface of the sacrificing layer in the lower layer is exposed, and repeating the steps of etching the mask layer and the composite layer until the plurality of layers of the laminated sacrificial layers are stepped, e.g., having a staircase structure, and the size decreases layer-by-layer in a bottom-up direction from the bottom layer to the top layer. Further, the method includes removing the sacrificial layers to form openings, and forming the control gate in the openings.

To form the stepped control gate 110, the stepped sacrificial layers need to be first formed. While the sacrificial layers are formed by using many steps (repeatedly etching the mask layer and etching the composite layer). For example, if the number of layers of the sacrificial layers is N, the total number of times of etching the mask layer is N−1, and the total number of times of etching the composite layer is N−1. Therefore, the process complexity increases and the cost increases.

Figure 15:
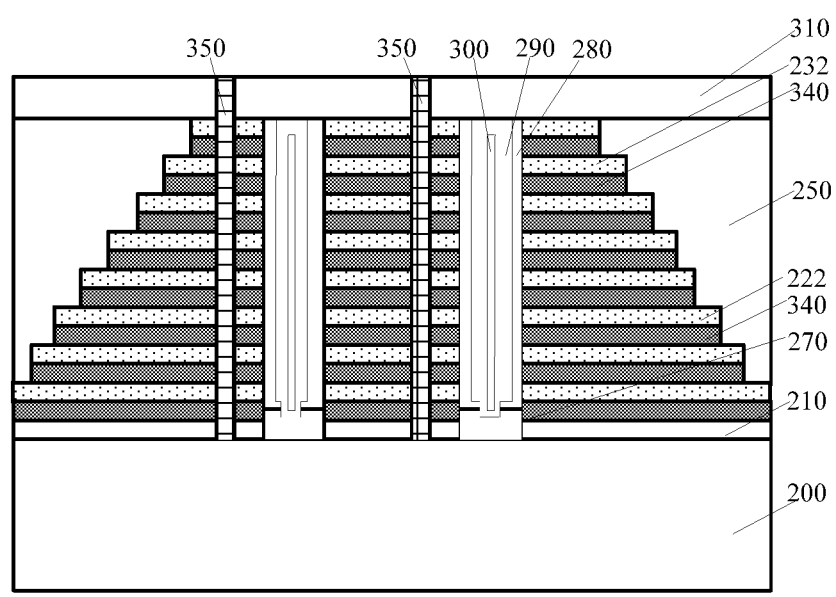
Figure 16:
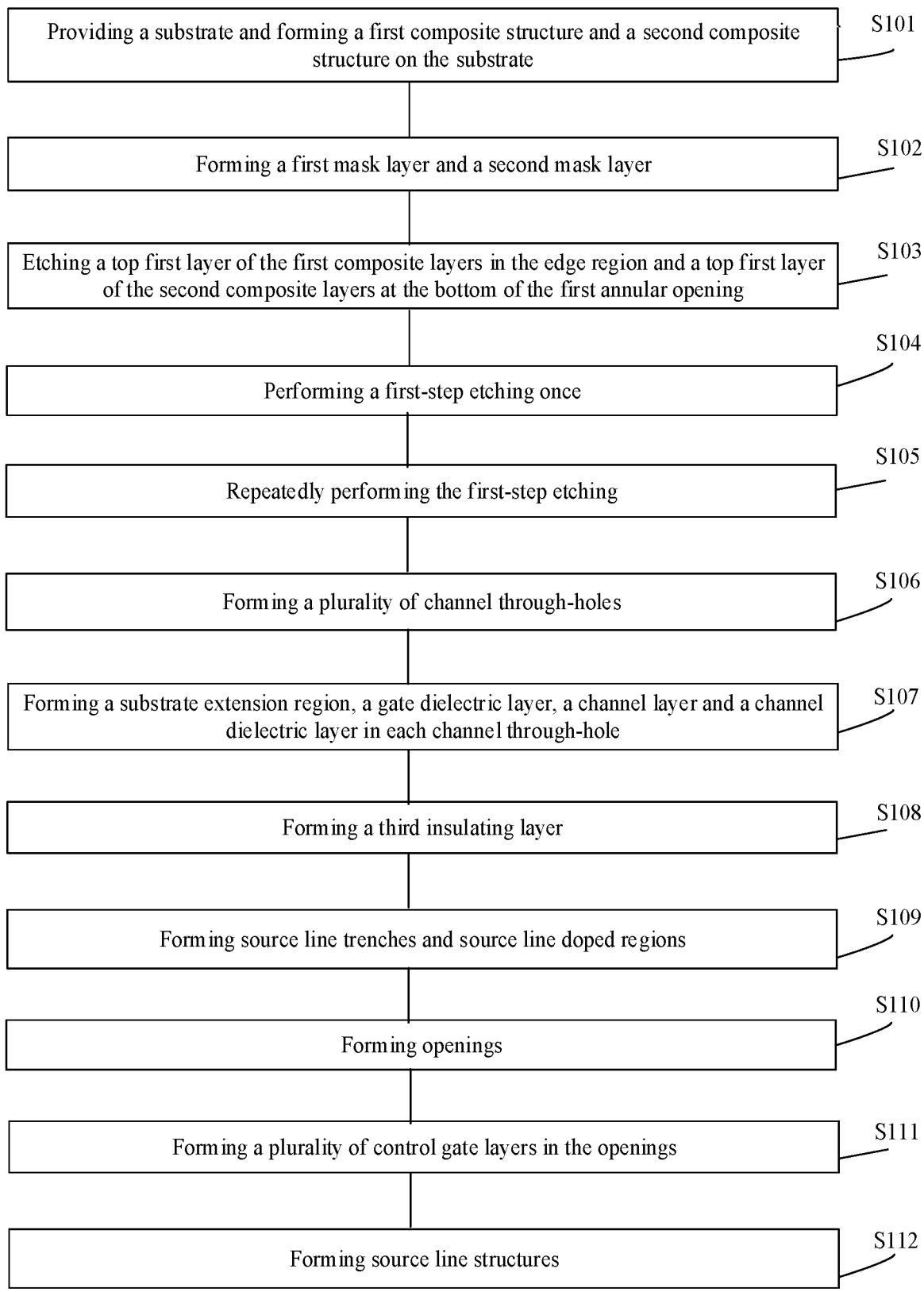
FIG. 16 illustrates an exemplary fabrication method for forming a semiconductor device consistent with various disclosed embodiments of the present disclosure.

The present disclosure provides a semiconductor device and fabrication method thereof. FIG. 16 illustrates an exemplary fabrication method for forming a semiconductor device consistent with various disclosed embodiments of the present disclosure; and FIGS. 2-15 illustrate semiconductor structures corresponding to certain stages of the exemplary fabrication method.

Figure 2:
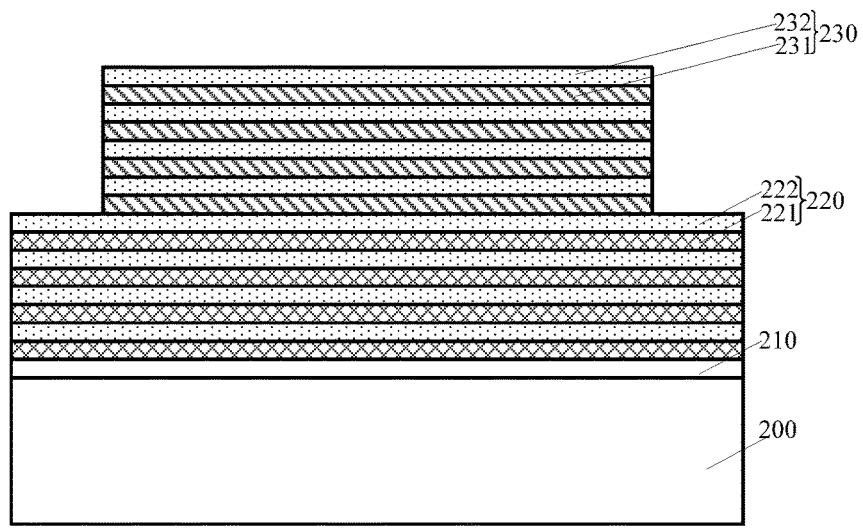
FIGS. 2-15 illustrate semiconductor structures corresponding to certain stages of an exemplary fabrication method for forming a semiconductor device consistent with various disclosed embodiments of the present disclosure.

As shown in FIG. 16, at the beginning of the fabrication method, a substrate with certain structures may be provided (S101). FIG. 2 illustrates a corresponding semiconductor structure.

Referring to FIG. 2, a substrate 200 may be provided. A first composite structure may be formed on the substrate 200. The first composite structure may include a core region and an edge region around the core region. A second composite structure may be formed on a first surface portion of the core region of the first composite structure. The first composite structure may include a plurality of laminated layers of first composite layers 220, and the second composite structure may include a plurality of laminated layers of second composite layers 230.

In one embodiment, the substrate 200 may be made of monocrystalline silicon, polysilicon, or amorphous silicon, etc. In certain embodiments, the substrate 200 may be made of silicon, germanium, silicon germanium, gallium arsenide, and other semiconductor materials. In one embodiment, the substrate 200 may be made of silicon. A direction pointing to the core region from the edge region may be parallel to the surface of the substrate 200.

The first composite structure may include a plurality of laminated layers of the first composite layers 220. Each first composite layer 220 may include a first sacrificial layer 221 and a first insulating layer 222 on the first sacrificial layer 221. In the actual process, the number of layers of the first composite layers 220 may be selected as desired. In one embodiment, the number of layers of the first composite layers 220 may be four or more than four. FIG. 2 illustrates four layers of the first composite layers 220 as an example.

The plurality of layers of the first composite layers 220 may be stacked from the bottom to the top. A stacked direction from the bottom to the top of the first composite layers 220 may be perpendicular to the surface of the substrate 200.

In each first composite layer 220, the first sacrificial layer 221 may occupy locations for portions of subsequently formed control gate layer. The first sacrificial layer 221 may be subsequently removed, and portions of the control gate layer may be formed in the removed locations after removing the first sacrificial layer 221. For convenience of illustration, the control gate layer subsequently formed in the removed locations after removing the first sacrificial layer 221 may be referred to first control gate layer.

In one embodiment, a dielectric layer 210 may be formed between the substrate 200 and the first composite structure. The dielectric layer 210 may be made of silicon oxide, silicon oxynitride, or silicon carboxynitride, etc. The dielectric layer 210 may isolate the substrate 200 and the first composite structure. After subsequently removing the first sacrificial layer 221 and forming the first control gate layer in the removed locations after removing the first sacrificial layer 221, the dielectric layer 210 may isolate the substrate 200 and the first control gate layer.

The first sacrificial layers 221 may be formed between adjacent two layers of the first insulating layers 222 and between the bottom layer of the first insulating layer 222 and the dielectric layer 210. The locations of the first sacrificial layers 221 may be subsequently replaced by the first control gate layer, such that the first insulating layer 222 may electrically isolate the adjacent layers of the first control gate layer. The dielectric layer 210 may electrically isolate the first control gate layer and substrate 200.

The second composite structure may include a plurality of laminated layers of the second composite layers 230. Each second composite layer 230 may include a second sacrificial layer 231 and a second insulating layer 232 on the second sacrificial layer 231. In the actual process, the number of layers of the second composite layers 230 may be selected as desired. In one embodiment, the number of layers of the second composite layers 230 may be four or more than four. FIG. 2 illustrates four layers of the second composite layers 230 as an example.

In one embodiment, the number of layers of the second composite layers 230 may be the same as the number of layers of the first composite layers 220. In certain embodiments, the number of layers of the second composite layers 230 may be different from the number of layers of the first composite layers 220.

The plurality of layers of the second composite layers 230 may be stacked from the bottom to the top. A stacked direction from the bottom to the top of the second composite layers 230 may be perpendicular to the surface of the substrate 200.

In each second composite layer 230, the second sacrificial layer 231 may occupy locations for portions of subsequently formed control gate layer. The second sacrificial layer 231 may be subsequently removed, and portions of the control gate layer may be formed in the removed locations after removing the second sacrificial layer 231. For convenience of illustration, the control gate layer subsequently formed in the removed locations after removing the second sacrificial layer 231 may be referred to second control gate layer.

The second sacrificial layers 231 may be formed between adjacent two layers of the second insulating layers 232 and between the top layer of the first insulating layers 222 and the bottom layer of the second insulating layers 232. The locations of the second sacrificial layer 231 may be subsequently replaced by the second control gate layer, such that the second insulating layer 232 may electrically isolate the adjacent second control gate layers.

The first insulating layer 222 may also electrically isolate the top layer of the first control gate layers and the bottom layer of the second control gate layers. The first insulating layer 222 may be made of a material different from the first sacrificial layer 221. When subsequently removing the first sacrificial layer 221, the first sacrificial layer 221 may have a higher etching selectivity compared to the first insulating layer 222, to ensure that the first insulating layer 222 have good morphology and accurate size, such that the subsequently formed first control gate layer may have good morphology and accurate size. In addition, the first sacrificial layer 221 may be made of a material that is easy to be removed. In one embodiment, the first insulating layer 222 may be made of silicon oxide, silicon oxynitride, or silicon carboxynitride, etc. The first sacrificial layer 221 may be made of silicon nitride, amorphous carbon, or polysilicon, etc. In one embodiment, the first insulating layer 222 may be made of silicon oxide, and the first sacrificial layer 221 may be made of silicon nitride.

The second insulating layer 232 may be made of a material different from the second sacrificial layer 231. When subsequently removing the second sacrificial layer 231, the second sacrificial layer 231 may have a higher etching selectivity compared to the second insulating layer 232, to ensure that the second insulating layer 232 have good morphology and accurate size, such that the subsequently formed second control gate layer may have good morphology and accurate size. In addition, the second sacrificial layer 231 may be made of a material that is easy to be removed. In one embodiment, the second insulating layer 232 may be made of silicon oxide, silicon oxynitride, or silicon carboxynitride, etc. The second sacrificial layer 231 may be made of silicon nitride, amorphous carbon, or polysilicon, etc. In one embodiment, the second insulating layer 232 may be made of silicon oxide, and the second sacrificial layer 231 may be made of silicon nitride.

The method for forming the first composite structure and the second composite structure may include forming a first composite structure film on the substrate 200 and forming a second composite structure film on the first composite structure film. The first composite structure film may include a plurality of laminated layers of first composite films, and the second composite structure film may include a plurality of laminated layers of second composite films. The method may also include forming a first mask structure on portions of the second composite structure film; and etching the first composite structure film and the second composite structure film by using the first mask structure as an etch mask until the surface of the substrate 200 is exposed to form the first composite structure and a second composite intermediate structure on the first composite structure. In addition, the method may include removing the first mask structure; and forming a second mask structure on portions of the second composite intermediate structure. Further, the method may include etching the second composite intermediate structure by using the second mask structure as an etch mask until the surface of the first composite structure is exposed to form the second composite structure; and removing the second mask structure.

Figure 3:
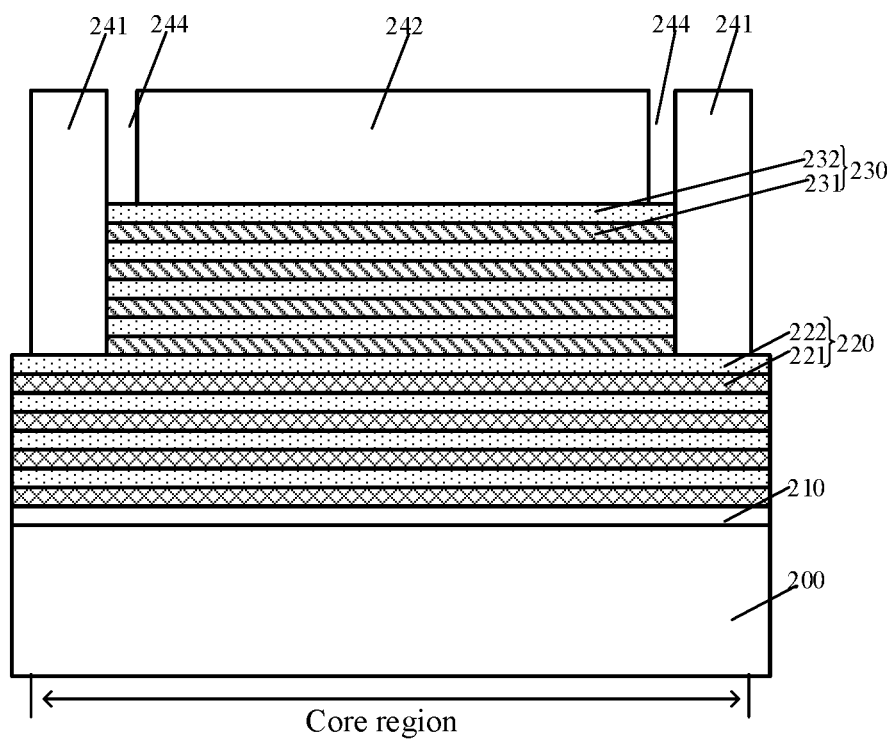

Returning to FIG. 16, after forming the first composite structure and the second composite structure, a first mask layer and a second mask layer may be formed (S102). FIG. 3 illustrates a corresponding semiconductor structure.

Referring to FIG. 3, a first mask layer 241 and a second mask layer 242 may be formed. The second mask layer 242 may be formed on a surface portion of the second composite structure. The first mask layer 241 may cover a sidewall of the second composite structure and a second surface portion of the core region outside of an outer peripheral of the second composite structure, and may expose at least a portion of the edge region of the first composite structure. The second mask layer 242 may be spaced apart from the first mask layer 241 by a first annular opening 244.

The first mask layer 241 and the second mask layer 242 may be made of a photoresist. In one embodiment, a method for forming the first mask layer 241 and the second mask layer 242 may include forming a mask initial layer on both the first composite layer and the second composite layer. The mask initial layer may be made of a photoresist. The method may also include sequentially performing an exposure process and a development process on the mask initial layer to form the first mask layer 241 and the second mask layer 242.

Figure 4:
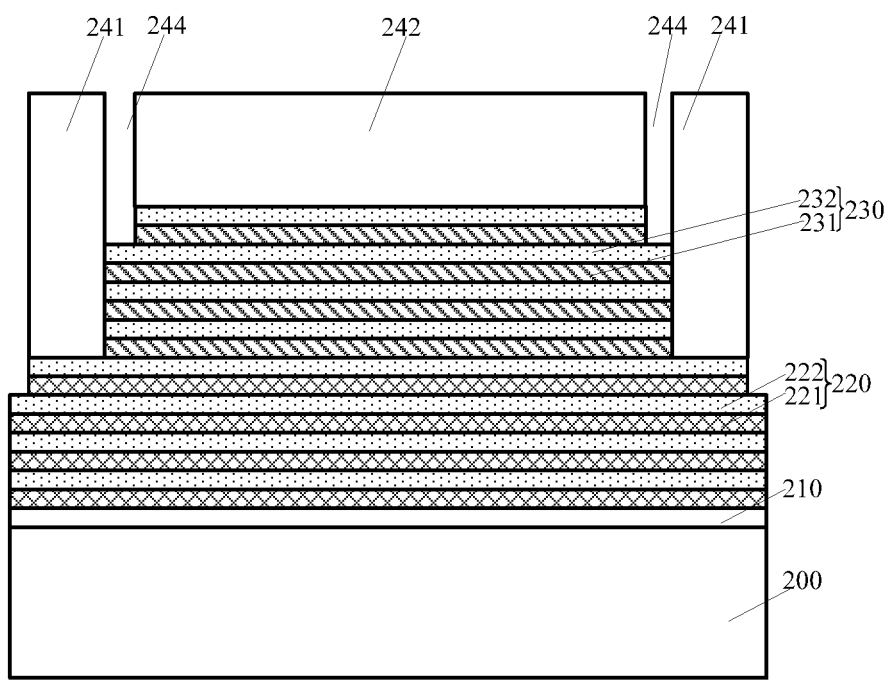

Returning to FIG. 16, after forming the first mask layer and the second mask layer, a top first layer of the first composite layers in the edge region and a top first layer of the second composite layers at the bottom of the first annular opening may be etched (S103). FIG. 4 illustrates a corresponding semiconductor structure.

Referring to FIG. 4, a top first layer of the first composite layers 220 in the edge region and a top first layer of the second composite layers 230 at the bottom of the first annular opening 244 may be etched by using the first mask layer 241 and the second mask layer 242 as an etch mask, until a top second layer of the first composite layers 220 in the edge region and a top second layer of the second composite layers 230 at the bottom of the first annular opening 244 are exposed.

In one embodiment, the process for etching the top first layer of the first composite layers 220 in the edge region and the top first layer of the second composite layers 230 at the bottom of the first annular opening 244 using the first mask layer 241 and the second mask layer 242 as an etch mask may include an anisotropic dry etching process. Parameters of the anisotropic dry etching process may include the following. Gases may include $CF_4$, $CHF_3$, $CH_2F_2$, $CH_3F$, $C_4F_6$, Ar, $O_2$ and $NF_3$; gas flow rate of $CF_4$, $CHF_3$, $CH_2F_2$, $CH_3F$, and $C_4F_6$ may be in a range of approximately 20 sccm-200 sccm, respectively; Ar gas flow rate may be in a range of approximately 200 sccm-2000 sccm; $O_2$ gas flow rate may be in a range of approximately 5 sccm-100 sccm; $NF_3$ gas flow rate may be in a range of approximately 5 sccm-100 sccm; a source RF power may be in a range of approximately 100 W-1000 W; a bias RF power may be in a range of approximately 10 W-1000 W; and a chamber pressure may be in a range of approximately 3 mtorr-100 mtorr.

Figure 5:
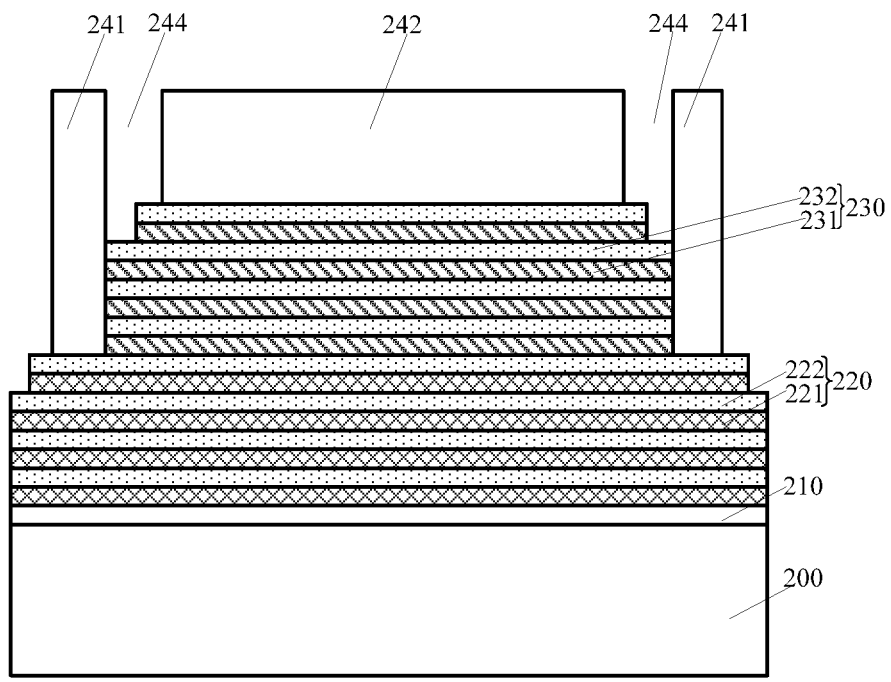
Figure 6:
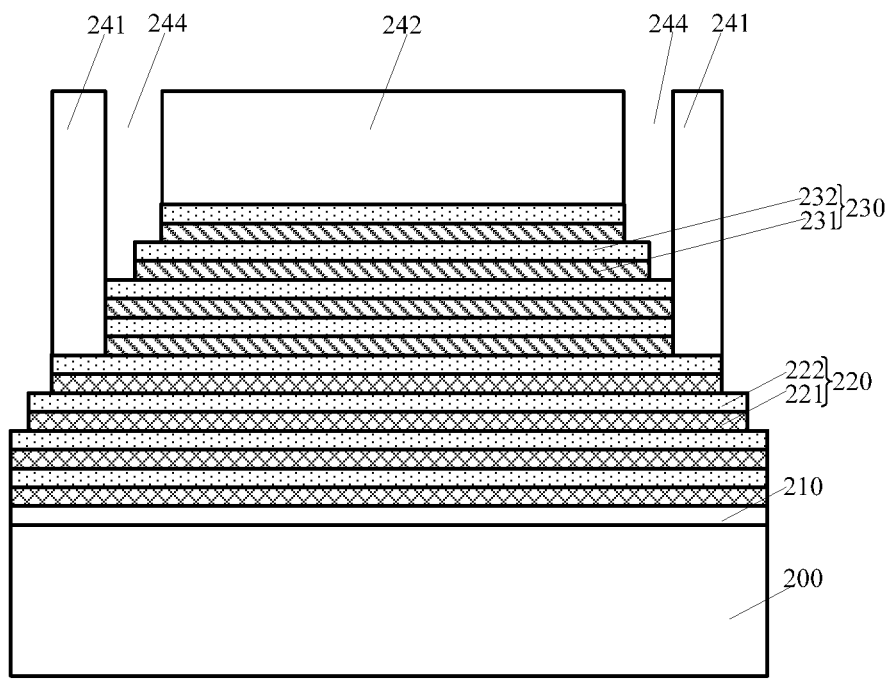

Returning to FIG. 16, after etching the top first layer of the first composite layers in the edge region and the top first layer of the second composite layers at the bottom of the first annular opening, a first-step etching may be performed (S104). FIGS. 5-6 illustrate corresponding semiconductor structures.

After etching the top first layer of the first composite layers 220 in the edge region and the top first layer of the second composite layers 230 at the bottom of the first annular opening 244 using the first mask layer 241 and the second mask layer 242 as an etch mask, a first-step etching may be performed.

Referring to FIG. 5, the first-step etching may include etching a sidewall of the first mask layer 241 and a sidewall of the second mask layer 242 to expose a surface portion of the top first layer of the second composite layers 230 outside of an outer peripheral of the second mask layer 242 as well as a surface portion of the top first layer of the first composite layers 220 outside of an outer peripheral of the first mask layer 241. Referring to FIG. 6, the first-step etching may also include etching the exposed first composite layers 220 and the second composite layers 230 using the etched first mask layer 241 and the second mask layer 242 as an etch mask, until the top third layer of the first composite layers 220 and the top third layer of the second composite layers 230 are exposed.

In one embodiment, the top surfaces of the first mask layer 241 and the second mask layer 242 may be etched while etching the sidewall of the first mask layer 241 and the sidewall of the second mask layer 242. The process for etching the sidewall of the first mask layer 241 and the sidewall of the second mask layer 242 may include an isotropic dry etching process. Parameters of the isotropic dry etching process may include the following. Gases may include HBr, $CF_4$, $O_2$ and $N_2$; HBr gas flow rate may be in a range of approximately 10 sccm-200 sccm; $CF_4$ gas flow rate may be in a range of approximately 20 sccm-200 sccm; $O_2$ gas flow rate may be in a range of approximately 20 sccm-1000 sccm; $N_2$ gas flow rate may be in a range of approximately 80 sccm-4000 sccm; a source RF power may be in a range of approximately 100 W-2000 W; and a chamber pressure may be in a range of approximately 3 mtorr-1000 mtorr.

In one embodiment, after etching the sidewall of the first mask layer 241 and the sidewall of the second mask layer 242, the size of the exposed surface of the top first layer of the second composite layers 230 outside of an outer peripheral of the second mask layer 242 and the size of the exposed surface of the top first layer of the first composite layers 220 outside of an outer peripheral of the first mask layer 241 may be in a range of approximately 100 nm-500 nm. The size may be in a direction perpendicular to the sidewalls of the first mask layer 241 and the second mask layer 242.

In one embodiment, the process for etching the exposed first composite layers 220 and the second composite layers 230 using the etched first mask layer 241 and the second mask layer 242 as an etch mask may include an anisotropic dry etching process. Parameters of the anisotropic dry etching process may include the following. Gases may include $CF_4$, $CHF_3$, $CH_2F_2$, $CH_3F$, $C_4F_6$, Ar, $O_2$ and $NF_3$; gas flow rate of $CF_4$, $CHF_3$, $CH_2F_2$, $CH_3F$, and $C_4F_6$ may be in a range of approximately 20 sccm-200 sccm, respectively; Ar gas flow rate may be in a range of approximately 200 sccm-2000 sccm; $O_2$ gas flow rate may be in a range of approximately 5 sccm-100 sccm; $NF_3$ gas flow rate may be in a range of approximately 5 sccm-100 sccm; a source RF power may be in a range of approximately 100 W-1000 W; a bias RF power may be in a range of approximately 10 W-1000 W; and a chamber pressure may be in a range of approximately 3 mtorr-100 mtorr.

Figure 7:
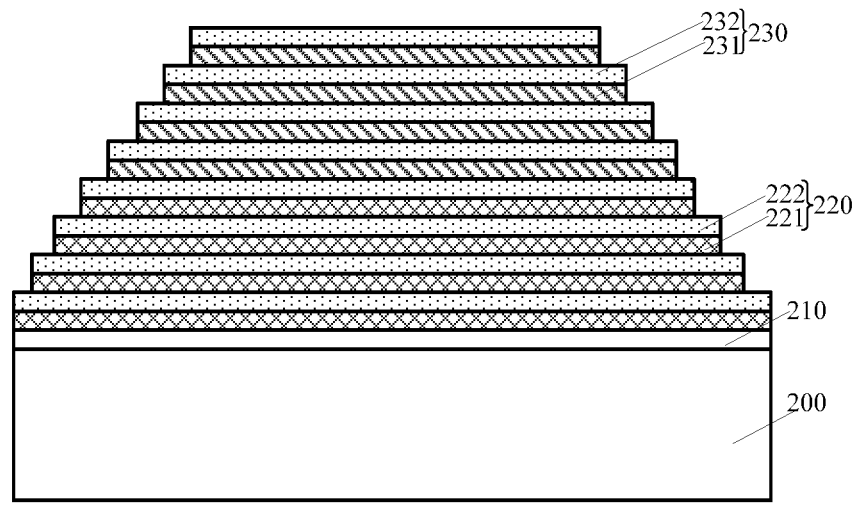

Returning to FIG. 16, after performing the first-step etching once, the first-step etching may be repeated (S105). FIG. 7 illustrates a corresponding semiconductor structure.

Referring to FIG. 7, after performing the first-step etching once, the first-step etching may be repeated until the bottom layer of the first composite layers 220 or the bottom layer of the second composite layers 230 is exposed. After exposing the bottom layer of the first composite layers 220 or the bottom layer of the second composite layers 230, the first mask layer 241 and the second mask layer 242 may be removed.

In one embodiment, the number of layers of the first composite layers 220 may be the same as the number of layers of the second composite layers 230. The bottom layer of the first composite layers 220 may be exposed while exposing the bottom layer of the second composite layers 230. The plurality of laminated layers of the first composite layers 220 and the plurality of laminated layers of the second composite layers 230 may be stepped, e.g., having a staircase structure, and the size decreases layer-by-layer in a bottom-up direction from the bottom layer to the top layer. For example, the pattern size of the plurality of laminated layers of the first composite layers 220 and the plurality of laminated layers of the second composite layers 230 projected on the surface of the substrate 200 from the bottom layer to the top layer may decrease layer-by-layer.

In certain embodiments, when the number of layers of the second composite layers 230 is greater than the number of layers of the first composite layers 220, the first-step etching may be repeated until the bottom layer of the first composite layers 220 is exposed. Then, the first mask layer 241 and the second mask layer 242 may be removed. After removing the first mask layer 241 and the second mask layer 242, a second-step etching may be performed on the second composite layers 230 until the plurality of laminated layers of the first composite layers 220 and the plurality of laminated layers of the second composite layers 230 are stepped, e.g., having a staircase structure, and the size decreases layer-by-layer in a bottom-up direction from the bottom layer to the top layer.

The second-step etching may include forming a fourth mask layer on the first composite structure and on the second composite structure. The fourth mask layer may include a second annular opening. The second annular opening may expose an edge of the top surface of the top first layer of the second composite layers 230 as well as the second composite layers 230 outside of an outer periphery of the top first layer of the second composite layers 230. The second-step etching may also include etching the exposed second composite layers 230 using the fourth mask layer as a mask until the bottom layer of the second composite layers 230 is exposed.

When the number of layers of the second composite layers 230 is one more than the number of layers of the first composite layers 220, the exposed second composite layers 230 may be etched using the fourth mask layer as an etch mask until the bottom layer of the second composite layers 230 is exposed. The plurality of laminated layers of the first composite layers 220 and the plurality of laminated layers of the second composite layers 230 may be stepped, e.g., having a staircase structure, and the size decreases layer-by-layer in a bottom-up direction from the bottom layer to the top layer.

When the number of layers of the second composite layers 230 is two more than the number of layers of the first composite layers 220, the second-step etching may also include: etching the exposed second composite layers 230 using the fourth mask layer as an etch mask until the second last bottom layer of the second composite layers 230 is exposed; etching the sidewall of the second annular opening to expose an edge of the top surface of the top first layer of the second composite layers 230 outside of an outer periphery of the fourth mask layer; and etching the exposed second composite layers 230 using the etched fourth mask layer as an etch mask until the bottom layer of the second composite layers 230 is exposed.

When the number of layers of the second composite layers 230 is three more than the number of layers of the first composite layers 220, the second-step etching may also include: repeating the steps of etching the sidewall of the second annular opening and etching the exposed second composite layers 230, until the plurality of laminated layers of the first composite layers 220 and the plurality of laminated layers of the second composite layers 230 are stepped, e.g., having a staircase structure, and the size decreases layer-by-layer in a bottom-up direction from the bottom layer to the top layer.

In certain embodiments, when the number of layers of the first composite layers is greater than the number of layers of the second composite layers, the first-step etching may be repeated until the bottom layer of the second composite layers is exposed. Then, the first mask layer and the second mask layer may be removed. After removing the first mask layer and the second mask layer, a third-step etching may be performed on the first composite layers until the plurality of laminated layers of the first composite layers and the plurality of laminated layers of the second composite layers are stepped, e.g., having a staircase structure, and the size decreases layer-by-layer in a bottom-up direction from the bottom layer to the top layer.

The third-step etching may include forming a third mask layer on the first composite structure and the second composite structure. The third-step etching may also include etching the sidewall of the third mask layer to expose an edge of the top surface of the top first layer of the first composite layers outside of an outer periphery of the third mask layer. Further, the third-step etching may include etching the exposed first composite layers using the etched third mask layer as a mask until the bottom layer of the first composite layers is exposed.

The width and depth of the first annular opening 244 may continue to increase when repeating the first-step etching. Therefore, as the number of times of the first-step etching increases, the probability of exposing the top surface of the first composite structure by the first annular opening 244 may increase. To avoid exposing the top surface of the first composite structure by the first annular opening 244, in one embodiment, for the first mask layer 241 and the second mask layer 242 formed by a single exposure process, the number of times of etching the sidewall of the first annular opening 244 to expose the surface of the top first layer of the second composite layers outside of an outer peripheral of the second mask layer 242 may be less than or equal to 5. In other words, the number of times of performing the first-step etching may be less than or equal to 5. For the first mask layer 241 and the second mask layer 242 formed by the single exposure process, after performing the first-step etching 5 times, the first mask layer and the second mask layer may need to be reformed. On the basis of the first mask layer and the second mask layer formed by a new exposure process, the first-step etching may be performed until the bottom layer of the first composite layers or the bottom layer of the second composite layers is exposed.

To avoid exposing the top surface of the first composite structure by the first annular opening, in another embodiment, before forming the first mask layer and the second mask layer, a protection layer may be formed in corner regions of the first composite structure and the second composite structure. The protection layer may cover portions of the top surface of the first composite structure and expose the stepped region that need to be subsequently formed. The protection layer may also cover at least the sidewall of the bottom layer of the second composite layers among the sidewall of the second composite structure. After the plurality of laminated layers of the first composite layers and the plurality of laminated layers of the second composite layers are stepped, e.g., having a staircase structure, and the size decreases layer-by-layer in a bottom-up direction from the bottom layer to the top layer, the protection layer may be removed.

In one embodiment, the protection layer may cover portions of the top surface of the first composite structure and expose the stepped region that need to be subsequently formed. The protection layer may also cover the sidewall of the bottom layer of the second composite layers. When performing the first-step etching, the second-step etching and the third-step etching, the protection layer may not be easily dumped. Correspondingly, additional processes may not be needed to remove the dumped portion of the protection layer. In one embodiment, the protection layer may be made of polysilicon.

A method for forming the protection layer may include forming a protection material layer on the top surface of the first composite structure and on the top surface and sidewall of the second composite structure before forming the first mask layer and the second mask layer. The method may also include forming a mask sacrificial layer on portions of the surface of the protection material layer. The mask sacrificial layer may cover portions of the protection material layer on the top surface of the first composite structure and cover the protection material layer on the sidewall of the second composite structure. The mask sacrificial layer may expose the top surface of the second composite structure. In addition, the method may include etching the protection material layer by using the mask sacrificial layer as a mask until the top surfaces of the first composite structure and the second composite structure are exposed to form the protection layer. Further, the method may include removing the mask sacrificial layer.

When etching the protection material layer, the mask sacrificial layer may also be etched, such that the mask sacrificial layer may expose portions of the protection material layer on the sidewall of the second composite structure. The exposed portions of the protection material layer on the sidewall of the second composite structure may also be etched and removed. By adjusting process parameters for etching the protection material layer and the mask sacrificial layer, the height of the sidewall of the second mask layer covered by the protection layer may be controlled.

The process for forming the protection layer may include a deposition process, such as a plasma chemical vapor deposition process, an atomic layer deposition process, or a low pressure chemical vapor deposition process, etc. The mask sacrificial layer may be made of a photoresist.

After the plurality of laminated layers of the first composite layers 220 and the plurality of laminated layers of the second composite layers 230 are stepped, e.g., having a staircase structure, and the size decreases layer-by-layer in a bottom-up direction from the bottom layer to the top layer, the first composite structure and the second composite structure may include the stepped region. The plurality of layers of the first composite layers 220 and the plurality of layers of the second composite layers 230 in the stepped region are stepped in a bottom-up direction from the bottom layer to the top layer.

In the stepped region, along the direction perpendicular to the sidewalls of the first composite structure and the second composite structure, the size of the top surfaces of each layer of the first composite structure and each layer of the second composite structure may be in a range of approximately 100 nm-500 nm. If the size of the top surfaces of each layer of the first composite structure and each layer of the second composite structure along the direction perpendicular to the sidewalls of the first composite structure and the second composite structure is larger than 500 nm, the area ratio occupied by the stepped region may be too large and the formation space for other structures in the semiconductor device may be too small to facilitate the formation of the other structures in the semiconductor device. If the size of the top surfaces of each layer of the first composite structure and each layer of the second composite structure along the direction perpendicular to the sidewalls of the first composite structure and the second composite structure is smaller than 100 nm, the process window of subsequent word line plugs may be too small, such that one word line plug may touch the surfaces of a plurality of layers of the first composite layers in the stepped region.

Figure 8:
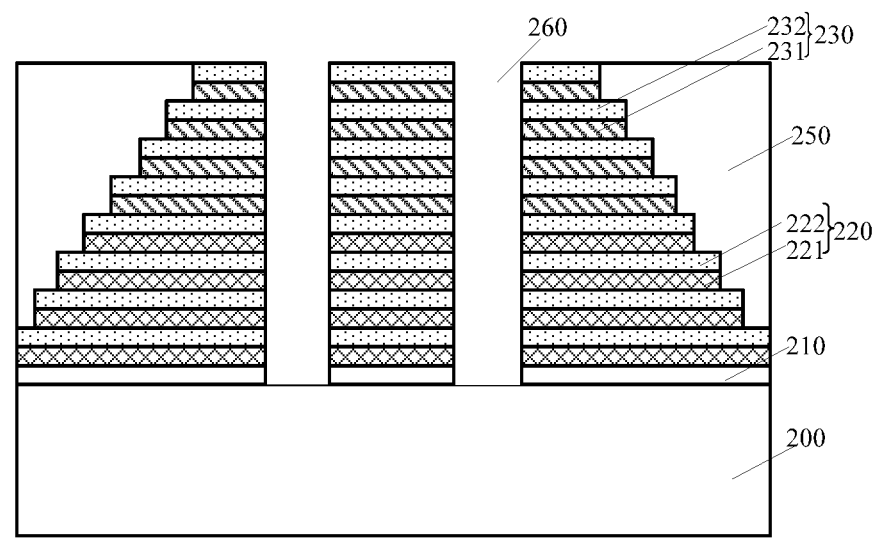
Figure 9:
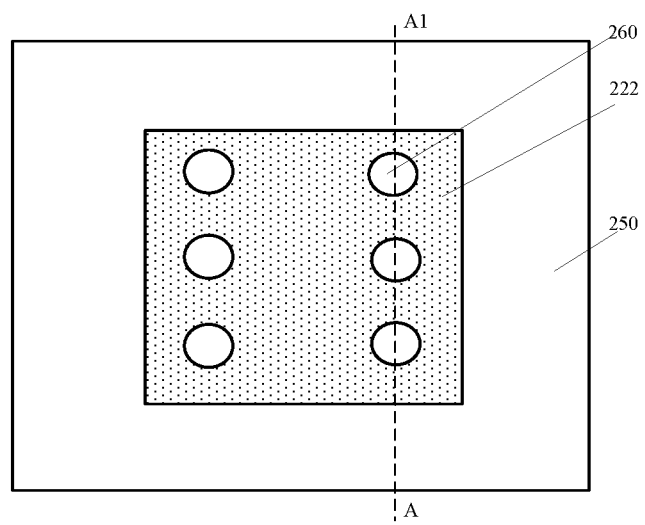

Returning to FIG. 16, after completing the first-step etching, a plurality of channel through-holes may be formed (S106). FIGS. 8-9 illustrate a corresponding semiconductor structure.

Referring to FIG. 8, a stepped dielectric layer 250 may be formed in the stepped region, and the stepped dielectric layer 250 may expose the top surface of the top first layer of the second composite layers 230. Then, a plurality of channel through-holes 260 penetrating the first composite structure and the second composite structure may be formed. Bottom of each channel through-hole 260 may expose the surface of the substrate 200.

A method for forming the channel-through holes 260 may include forming a patterned mask layer (not illustrated) on the stepped dielectric layer 250 and on the second composite structure. The patterned mask layer may define positions of the channel through-holes 260. The patterned mask layer may be made of amorphous carbon. The method may also include etching the first composite structure and the second composite structure using the patterned mask layer as a mask. In one embodiment, an anisotropic dry etching process may be performed to etch the first composite structure and the second composite structure until the surface of the substrate 200 is exposed to form the channel through-holes 260. Further, the method may include removing the patterned mask layer defining the positions of the channel through-holes 260.

FIG. 9 illustrates a top-view facing toward the stepped dielectric layer 250 on the basis of FIG. 8, and FIG. 8 illustrates a cross-sectional view along a line 'AA1' in FIG. 9. FIG. 9 illustrates the shape and positions of the channel through-holes 260. In one embodiment, the channel through-holes 260 may have a cylindrical shape, and the channel through-holes 260 may be separately arranged. In certain embodiments, the channel through-holes 260 may have irregular shapes.

Figure 10:
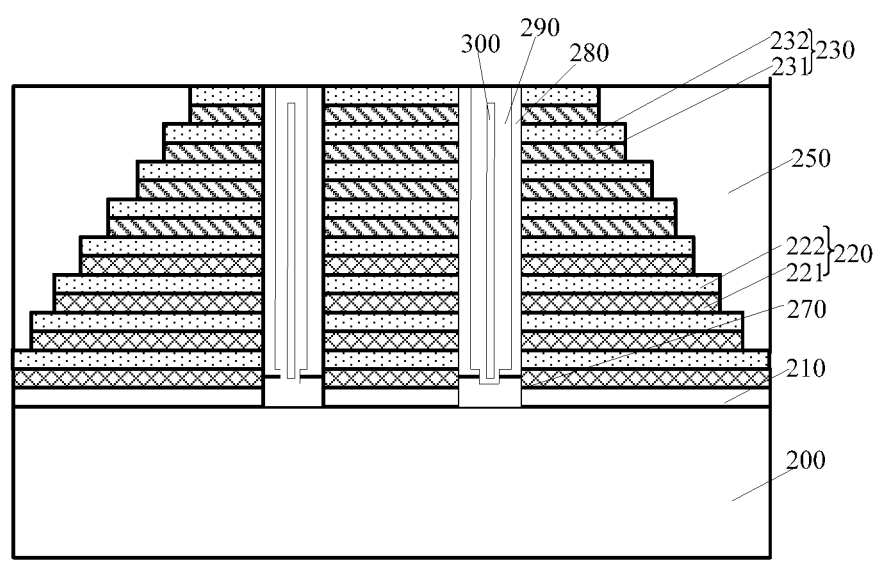

Returning to FIG. 16, after forming the plurality of channel through-holes, a substrate extension region, a gate dielectric layer, a channel layer and a channel dielectric layer may be formed (S107). FIG. 10 illustrates a corresponding semiconductor structure.

FIG. 10 illustrates a schematic on the basis of FIG. 8. Referring to FIG. 10, a substrate extension region 270 may be formed at the bottom of each channel through-hole 260. After forming the substrate extension region 270, a gate dielectric layer 280, a channel layer 290 and a channel dielectric layer 300 may be formed. The gate dielectric layer 280 may be formed on the sidewall of each channel through-hole 260 above the substrate extension region 270 and on portions of surface of the substrate extension region 270. The channel layer 290 may be formed in each channel through-hole 260, and on the surface of the gate dielectric layer 280. The channel dielectric layer 300 may be formed in each channel through-hole 260 and may be surrounded by the channel layer 290.

The substrate extension region 270 may be made of the same material as the substrate 200. A process for forming the substrate extension region 270 may include a selective epitaxial growth process. The substrate extension region 270 may increase the electron mobility.

A method for forming the gate dielectric layer 280, the channel layer 290, and the channel dielectric layer 300 may include forming a gate dielectric film at the bottom and on the sidewall of each channel through-hole 260, on the top surface of the second composite structure, and on the top surface of the stepped dielectric layer 250; and forming a first channel film on the surface of the gate dielectric film. The method may also include back-etching the first channel film and the gate dielectric film to etch through the first channel film and the gate dielectric film at the bottom of each channel through-hole 260 and to expose the top surface of the substrate extension region 270. At the same time, the first channel film as well as the gate dielectric film on the top surface of the second composite structure and on the top surface of the stepped dielectric layer 250 may be removed. In addition, the method may include forming a second channel film on the sidewall of the first channel film, on the bottom of each channel through-hole 260, on the top surface of the second composite structure and on the top surface of the stepped dielectric layer 250; and forming a channel dielectric film on the surface of the second channel film and completely filling each channel through-hole 260. Moreover, the method may include back-etching the channel dielectric film to remove the channel dielectric film on the second composite structure and on the stepped dielectric layer 250, and to remove portions of a thickness of the channel dielectric film in each channel through-hole 260 to form a trench; and forming a third channel film in the trench and on the surface of the second channel film. Further, the method may include planarizing the third channel film and the second channel film until the top surfaces of the second composite structure and the stepped dielectric layer 250 are exposed to form the gate dielectric layer 280, the channel layer 290, and the channel dielectric layer 300.

After planarizing the third channel film and the second channel film, the third channel film, the second channel film and the first channel film may form the channel layer 290. The gate dielectric layer 280 may correspond to the gate dielectric film. The channel dielectric layer 300 may correspond to the channel dielectric film.

In one embodiment, the gate dielectric layer 280 may include a top dielectric layer (not illustrated), a charge trapping layer (not illustrated), a tunneling dielectric layer (not illustrated), and a protective layer (not illustrated). The structure including the top dielectric layer, the charge trapping layer, the tunneling dielectric layer, and the protective layer may be referred to an ONON structure layer. The top dielectric layer, the charge trapping layer, the tunneling dielectric layer, and the protective layer may be sequentially stacked on the sidewall of each channel through-hole 260 from outside to inside.

The tunneling dielectric layer and the top dielectric layer may be made of silicon oxide. The charge trapping layer and the protective layer may be made of silicon nitride. In one embodiment, to ensure that the top dielectric layer, the charge trapping layer, the tunneling dielectric layer, and the protective layer on the sidewall of each channel through-hole 260 have a uniform thickness and a desired morphology, the material layers of the top dielectric layer, the charge trapping layer, the tunneling dielectric layer, and the protective layer may be formed in a tube furnace. In certain embodiments, the the top dielectric layer, the charge trapping layer, the tunneling dielectric layer, and the protective layer may be formed by a deposition process, such as an atomic layer deposition process.

In certain embodiments, the gate dielectric layer 280 may be an ONO structure layer. In other words, the gate dielectric layer 280 may include the top dielectric layer, the charge trapping layer, and the tunneling dielectric layer, while may not include the protective layer. The top dielectric layer, the charge trapping layer, and the tunneling dielectric layer may form the ONO structure layer. The tunneling dielectric layer and the top dielectric layer may be made of silicon oxide. The charge trapping layer may be made of silicon nitride. Compared to the ONO structure layer, the formed ONON structure layer may increase lifetime of the 3D NAND flash memory.

The first channel film may be made of polysilicon. The first channel film may be formed in the tube furnace. The first channel film may be capable of protecting the gate dielectric film on the sidewall of each channel through-hole 260 from etching damages when etching the gate dielectric film and the first channel film at the bottom of each channel through-hole 260 to expose the top surface of the substrate extension region 270.

The second channel film may be made of polysilicon. The second channel film may be formed in the tube furnace. The channel dielectric film may be made of silicon oxide. In one embodiment, a process for forming the channel dielectric film may include a deposition process, including a plasma chemical vapor deposition process, an atomic layer deposition process, a low pressure chemical vapor deposition process, or a sub-atmospheric pressure chemical vapor deposition process, etc. In certain embodiments, the channel dielectric film may be formed in the tube furnace.

The channel dielectric film may be capable of thinning the thickness of the second channel film. When the thickness of the second channel film is less than the size of single crystal grain, the crystal grains to be formed in the second channel film may be dispersed, such that a distribution band of the threshold voltage may be narrow. In certain embodiment, the channel dielectric film may not be formed.

The third channel film may be made of polysilicon. The third channel film may be formed in the tube furnace. A process for planarizing the third channel film and the second channel film may include a mechanical chemical polishing process, or a back-etching process, etc.

After forming the gate dielectric layer 280, the channel layer 290, and the channel dielectric layer 300, an ion implantation process may be performed on the top of the channel layer 290. Therefore, the top of the channel layer 290 may be doped with ions, and a drain region (not illustrated) may be formed on the top of the channel layer 290.

Figure 11:
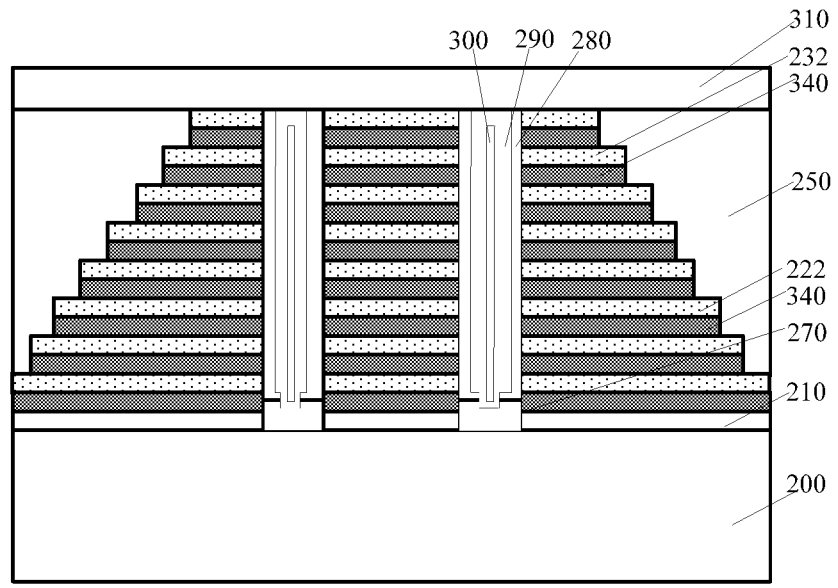

Returning to FIG. 16, after forming the substrate extension region, the gate dielectric layer, the channel layer and the channel dielectric layer, a third insulating layer may be formed (S108). FIG. 11 illustrates a corresponding semiconductor structure.

Referring to FIG. 11, a third insulating layer 310 may be formed to cover the gate dielectric layer 280, the channel layer 290, the second composite structure, and the stepped dielectric layer 250.

The third insulating layer 310 may be made of silicon oxide, silicon oxynitride, or silicon oxycarbide, etc. A process for forming the third insulating layer 310 may include a deposition process, including a plasma chemical vapor deposition process, an atomic layer deposition process, a low pressure chemical vapor deposition process, or a sub-atmospheric pressure chemical vapor deposition process, etc.

Figure 12:
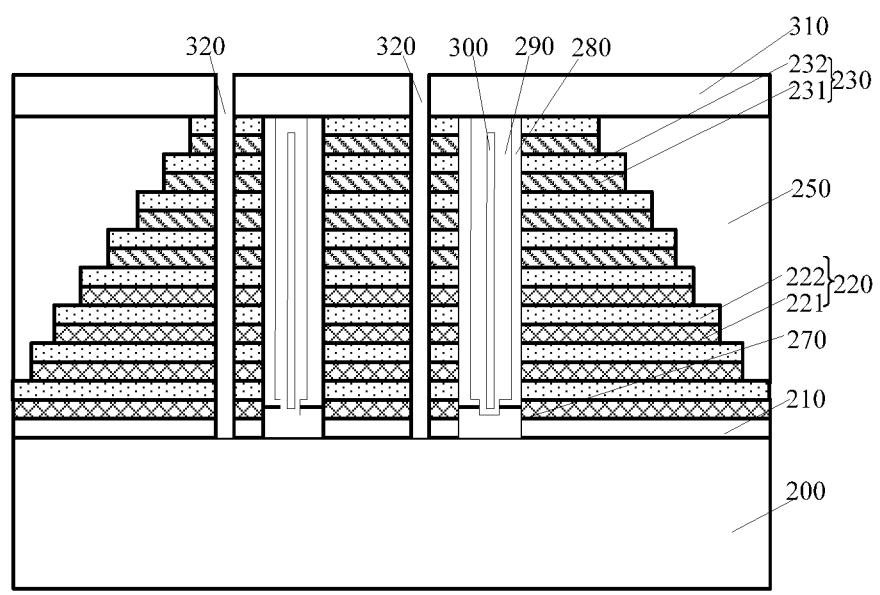

Returning to FIG. 16, after forming the third insulating layer, source line trenches and source line doped regions may be formed (S109). FIG. 12 illustrates a corresponding semiconductor structure.

Referring to FIG. 12, source line trenches 320 may be formed to penetrate the third insulating layer 310, the first composite structure and the second composite structure. A source line doped region (not illustrated) may be formed in the substrate 200 at the bottom of each source line trench 320.

Figure 13:
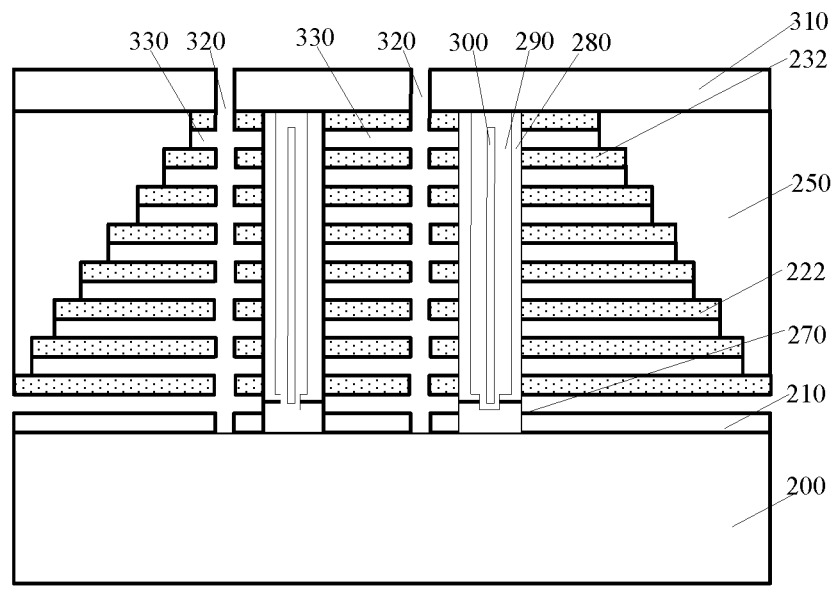

Returning to FIG. 16, after forming the source line trenches and the source line doped regions, openings may be formed (S110). FIG. 13 illustrates a corresponding semiconductor structure.

Referring to FIG. 13, openings 330 may be formed by removing the first sacrificial layers 221 and the second sacrificial layers 231 after forming the source line doped regions.

Figure 14:
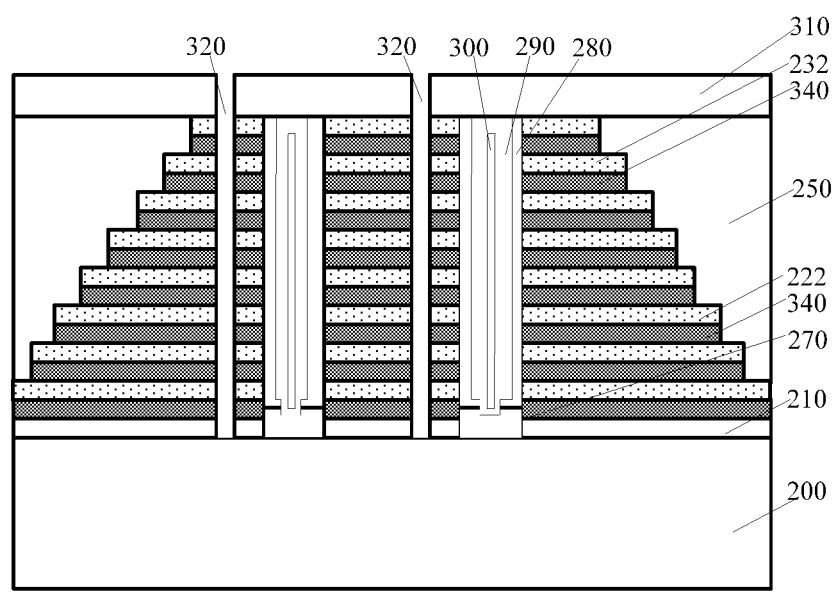

Returning to FIG. 16, after forming the openings, control gate layers may be formed (S111). FIG. 14 illustrates a corresponding semiconductor structure.

Referring to FIG. 14, a plurality of control gate layers 340 may be formed in openings 330 (illustrated in FIG. 13). The control gate layer 340 may be made of a metal, such as tungsten. A process for forming the control gate layer 340 may include a deposition process, such as a chemical vapor deposition process. After forming the control gate layers 340, a plurality of the control gate layers 340 in the stepped region may be stepped, e.g., having a staircase structure, and the size decreases layer-by-layer in a bottom-up direction from the bottom layer to the top layer.

In one embodiment, before forming the control gate layers 340, a control gate isolation layer (not illustrated) and a barrier layer (not illustrated) may be formed on the sidewall of each opening 330 from outside to inside. The control gate isolation layer may be made of silicon oxide. The barrier layer may be made of titanium nitride.

In one embodiment, if the material of the control gate layer 340 is also formed in the source line trenches 320 when forming the control gate layer 340, an anisotropic etching process may be used to remove the material of the control gate layer 340 in the source line trenches 320.

Returning to FIG. 16, after forming the control gate layers, source line structures may be formed (S112). FIG. 15 illustrates a corresponding semiconductor structure.

Referring to FIG. 15, source line structures 350 may be formed in the source line trenches 320. Each source line structure 350 may include a source isolation layer at the bottom and on the sidewall of each source line trench 320, and a source conductive layer on the surface of the source isolation layer. The source isolation layer may be made of silicon oxide, silicon oxynitride, or silicon oxycarbide, etc. The source conductive layer may be made of a metal, such as tungsten.

In one embodiment, the gate dielectric layer 280 may be formed on the sidewall of each channel through-hole 260. In certain embodiments, a gate dielectric layer may be formed on the inner sidewall of each opening before forming the control gate layer, and then the control gate layer may be formed. When the gate dielectric layer is formed on the inner sidewall of each opening, if the control gate isolation layer and the barrier layer need to be formed, the barrier layer may be formed between the control gate layer and the gate dielectric layer, and the gate dielectric layer may be formed after forming the control gate isolation layer.

In one embodiment, after forming the source line structures 350, a word line plug may be respectively formed on the surface of each control gate layer 340 in the stepped region. A word line may be formed on the top of each word line plug. A plurality of bit line plugs may be formed to penetrate the third insulating layer 310 and to connect to the channel layer 290. A plurality of discrete bit lines may be formed on the top surface of the plurality of bit line plugs and across the source line structures 350.

When the number of layers of the first composite layers is two and the number of layers of the second composite layers is two, after etching one layer of the first composite layers in the edge region and one layer of the second composite layers at the bottom of the first annular opening by using the first mask layer and the second mask layer as an etch mask, the first mask layer and the second mask layer may be removed. The plurality of laminated layers of the first composite layers and the plurality of laminated layers of the second composite layers may be stepped, e.g., having a staircase structure, and the size decreases layer-by-layer in a bottom-up direction from the bottom layer to the top layer.

When the number of layers of the first composite layers is two and the number of layers of the second composite layers is three and more than three, after etching one layer of the first composite layers in the edge region and one layer of the second composite layers at the bottom of the first annular opening by using the first mask layer and the second mask layer as an etch mask, the first mask layer and the second mask layer may be removed. The second-step etching may be performed on the second composite layers after removing the first mask layer and the second mask layer until the plurality of laminated layers of the first composite layers and the plurality of laminated layers of the second composite layers are stepped, e.g., having a staircase structure, and the size decreases layer-by-layer in a bottom-up direction from the bottom layer to the top layer.

When the number of layers of the first composite layers is three and more than three and the number of layers of the second composite layers is two, after etching one layer of the first composite layers in the edge region and one layer of the second composite layers at the bottom of the first annular opening by using the first mask layer and the second mask layer as an etch mask, the first mask layer and the second mask layer may be removed. The third-step etching may be performed on the first composite layers after removing the first mask layer and the second mask layer until the plurality of laminated layers of the first composite layers and the plurality of laminated layers of the second composite layers are stepped, e.g., having a staircase structure, and the size decreases layer-by-layer in a bottom-up direction from the bottom layer to the top layer.

When both the number of layers of the first composite layers and the number of layers of the second composite layers are three, after performing the first-step etching, the first mask layer and the second mask layer may be removed. The plurality of laminated layers of the first composite layers and the plurality of laminated layers of the second composite layers may be stepped, e.g., having a staircase structure, and the size decreases layer-by-layer in a bottom-up direction from the bottom layer to the top layer.

When the number of layers of the first composite layers is three and the number of layers of the second composite layers is four and more than four, after performing the first-step etching, the first mask layer and the second mask layer may be removed. The second-step etching may be performed on the second composite layers after removing the first mask layer and the second mask layer until the plurality of laminated layers of the first composite layers and the plurality of laminated layers of the second composite layers are stepped, e.g., having a staircase structure, and the size decreases layer-by-layer in a bottom-up direction from the bottom layer to the top layer.

When the number of layers of the first composite layers is four and more than four and the number of layers of the second composite layers is three, after performing the first-step etching, the first mask layer and the second mask layer may be removed. The third-step etching may be performed on the first composite layers after removing the first mask layer and the second mask layer until the plurality of laminated layers of the first composite layers and the plurality of laminated layers of the second composite layers are stepped, e.g., having a staircase structure, and the size decreases layer-by-layer in a bottom-up direction from the bottom layer to the top layer.

Accordingly, in the fabrication method consistent with disclosed embodiments, the first mask layer and the second mask layer may be formed. The first composite structure in the edge region outside of an outer periphery of the first mask layer may be exposed, and the first annular opening may be formed between the first mask layer and the second mask layer. The top first layer of the first composite layers outside of an outer periphery of the first mask layer may be exposed, and the top first layer of the second composite layers outside of an outer periphery of the second mask layer may be exposed by the first annular opening. When etching the top first layer of the first composite layers in the edge region and the top first layer of the second composite layers at the bottom of the first annular opening by using the first mask layer and the second mask layer as an etch mask, the first composite layers in the edge region and the second composite layers at the bottom of the first annular opening may be etched at the same time, such that the number of times of etching the first composite layers and etching the second composite layers may be reduced. Therefore, the process for forming the semiconductor device may be simplified, and the process cost of the semiconductor device may be reduced.

In a certain embodiment, a staircase structure 3-D NAND Flash memory may be formed in accordance with various disclosed embodiments. The staircase structure may be divided to two parts that are simultaneously formed and thus to form the staircase structure. Depend on the number of ON pairs, the staircase structure may be divided to more than two parts that are simultaneously formed and thus to form the staircase structure. In one example, a stair width of the staircase structure may be from about 100 nm to about 500 nm. One etching process may be used to simultaneously form two or more stairs, some on the top stairs and some on the lower stairs of the staircase structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
    forming a first composite structure including a core region and an edge region around the core region, on a substrate, wherein the first composite structure includes a plurality of laminated layers of first composite layers;
    forming a second composite structure on a first surface portion of the core region of the first composite structure, wherein the second composite structure includes a plurality of laminated layers of second composite layers and has edge regions on opposite sides of the second composite structure;
    forming a first mask layer, covering a sidewall of the second composite structure and a second surface portion of the core region of the first composite structure outside of an outer peripheral of the second composite structure and exposing at least a portion of the edge region of the first composite structure;
    forming a second mask layer, on a surface portion of the second composite structure, exposing at least a portion of each of the edge regions of the second composite structure, and spaced apart from the first mask layer by a first annular opening; and
    etching simultaneously a top first layer of the plurality of laminated layers of the first composite layers from two opposing ends of the first composite layer in the edge region of the first composite structure and a top first layer of the plurality of laminated layers of the second composite layers from two opposing ends of the second composite layer at a bottom of the first annular opening, using the first mask layer and the second mask layer as an etch mask.

2. The method according to claim 1, when both the plurality of laminated layers of the first composite layers and the plurality of laminated layers of the second composite layers have three and more laminated layers, further including:
    performing a first-step etching after etching the top first layer of the plurality of laminated layers of the first composite layers in the edge region of the first composite structure and the top first layer of the plurality of laminated layers of the second composite layers at the bottom of the first annular opening, wherein the first-step etching includes:
    etching a sidewall of the first mask layer and a sidewall of the second mask layer to expose a surface portion of the top first layer of the plurality of laminated layers of the second composite layers outside of an outer peripheral of the second mask layer and a surface portion of the top first layer of the plurality of laminated layers of the first composite layers outside of an outer peripheral of the first mask layer, and
    etching the exposed plurality of laminated layers of the first composite layers and the plurality of laminated layers of the second composite layers, respectively, using the etched first mask layer and the second mask layer as an etch mask to form the plurality of laminated layers of the first composite layers and the plurality of laminated layers of the second composite layers, respectively.

3. The method according to claim 2, when both the plurality of laminated layers of the first composite layers and the plurality of laminated layers of the second composite layers have three laminated layers, further including:
    removing the first mask layer and the second mask layer after performing the first-step etching once, wherein:
    the plurality of laminated layers of the first composite layers are in a stepped fashion having a size decreased layer-by-layer in a bottom-up direction, and
    the plurality of laminated layers of the second composite layers are in a stepped fashion having a size decreased layer-by-layer in the bottom-up direction.

4. The method according to claim 2, when both the plurality of laminated layers of the first composite layers and the plurality of laminated layers of the second composite layers have four and more laminated layers, further including:
    removing the first mask layer and the second mask layer after performing the first-step etching once; and
    performing a second-step etching on the second composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

5. The method according to claim 2, when both the plurality of laminated layers of the first composite layers and the plurality of laminated layers of the second composite layers have three laminated layers, further including:
removing the first mask layer and the second mask layer after performing the first-step etching once; and
performing a second-step etching on the first composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

6. The method according to claim 2, when both the plurality of laminated layers of the first composite layers and the plurality of laminated layers of the second composite layers have four and more laminated layers, further including:
repeatedly performing the first-step etching after performing the first-step etching once until one of a bottom layer of the plurality of laminated layers of the first composite layers and a bottom layer of the plurality of laminated layers of the second composite layers is exposed; and
removing the first mask layer and the second mask layer after exposing one of the bottom layer of the plurality of laminated layers of the first composite layers and the bottom layer of the plurality of laminated layers of the second composite layers.

7. The method according to claim 6, wherein:
when the plurality of laminated layers of the first composite layers have a same number of layers as the plurality of laminated layers of the second composite layers,
the bottom layer of the plurality of laminated layers of the first composite layers is exposed while exposing the bottom layer of the plurality of laminated layers of the second composite layers, and the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

8. The method according to claim 6, when the plurality of laminated layers of the first composite layers have more layers than the plurality of laminated layers of the second composite layers, further including:
removing the first mask layer and the second mask layer after repeatedly performing the first-step etching until the bottom layer of the plurality of laminated layers of the second composite layers is exposed; and
performing a second-step etching on the plurality of laminated layers of the first composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

9. The method according to claim 6, when the plurality of laminated layers of the first composite layers have more layers than the plurality of laminated layers of the second composite layers, further including:
removing the first mask layer and the second mask layer after repeatedly performing the first-step etching until the bottom layer of the plurality of laminated layers of the first composite layers is exposed; and
performing a second-step etching on the plurality of laminated layers of the second composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

10. The method according to claim 1, when the plurality of laminated layers of the first composite layers have two layers and the plurality of laminated layers of the second composite layers have two layers, further including:
removing the first mask layer and the second mask layer after etching the top first layer of the plurality of laminated layers of the first composite layers in the edge region of the first composite structure and the top first layer of the plurality of laminated layers of the second composite layers at the bottom of the first annular opening, wherein the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

11. The method according to claim 1, when the plurality of laminated layers of the first composite layers have two layers and the plurality of laminated layers of the second composite layers have three and more layers, further including:
removing the first mask layer and the second mask layer after etching the top first layer of the plurality of laminated layers of the first composite layers in the edge region of the first composite structure and the top first layer of the plurality of laminated layers of the second composite layers at the bottom of the first annular opening; and
performing a second-step etching on the plurality of laminated layers of second composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

12. The method according to claim 1, when the plurality of laminated layers of the first composite layers have three and more layers and the plurality of laminated layers of the second composite layers have two layers, further including:
removing the first mask layer and the second mask layer after etching the top first layer of the plurality of laminated layers of the first composite layers in the edge region of the first composite structure and the top first layer of the plurality of laminated layers of the second composite layers at the bottom of the first annular opening; and
performing a first-step-etching on the plurality of laminated layers of the first composite layers after removing the first mask layer and the second mask layer until the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers.

13. The method according to claim 12, wherein the first-step-etching includes:
forming a third mask layer on both the first composite structure and the second composite structure;
etching a sidewall of the third mask layer to expose a surface portion of the top first layer of the plurality of laminated layers of the first composite layers outside of an outer periphery of the third mask layer; and
etching the exposed first composite layers, using the etched third mask layer as an etch mask to expose a following layer of the plurality of laminated layers of the first composite layers.

14. The method according to claim 1, wherein:
each of the plurality of laminated layers of the first composite layer includes a first sacrificial layer and a first insulating layer on the first sacrificial layer; and
each of the plurality of laminated layers of the second composite layer includes a second sacrificial layer and a second insulating layer on the second sacrificial layer.

15. The method according to claim 14, further including:
removing the first sacrificial layers and the second sacrificial layers to form openings after the plurality of laminated layers of the first composite layers and the plurality of laminated layers of the second composite layers are stepped, and a respective size decreases layer-by-layer from a respective bottom layer to a respective top layer of each of the plurality of laminated layers of the first composite layers and plurality of laminated layers of the second composite layers; and
forming a plurality of control gate layers in the openings.

16. The method according to claim 1, wherein:
a size of an exposed surface of the top first layer of the plurality of laminated layers of the first composite structure is in a range of approximately 100 nm-500 nm; and
a size of an exposed surface of the top first layer of the plurality of laminated layers of the second composite structure is in a range of approximately 100 nm-500 nm.

* * * * *